(12) United States Patent
Kim (10) Patent No.: US 11,071,240 B2
(45) Date of Patent: Jul. 20, 2021

(54) POWER CONVERTING APPARATUS (71) Applicants: HYUNDAI MOTOR COMPANY, Seoul (KR); KIA MOTORS CORPORATION, Seoul (KR)

(72) Inventor: Yun Ho Kim, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/556,804

(22) Filed: Aug. 30, 2019

(65) Prior Publication Data

US 2020/0352059 A1 Nov. 5, 2020

(30) Foreign Application Priority Data

May 3, 2019 (KR) .................. 10-2019-0052485

(51) Int. Cl.
*H05K 7/20* (2006.01)
*H05K 1/18* (2006.01)
*H05K 7/14* (2006.01)
*H01L 23/473* (2006.01)
*B60L 15/00* (2006.01)

(52) U.S. Cl.
CPC ........ *H05K 7/20927* (2013.01); *B60L 15/007* (2013.01); *H01L 23/473* (2013.01); *H05K 1/182* (2013.01); *H05K 7/1432* (2013.01); *H05K 7/20872* (2013.01); *B60L 2210/40* (2013.01); *B60L 2240/525* (2013.01)

(58) Field of Classification Search
CPC .. H05K 7/20927; H05K 1/182; H05K 7/1432; H05K 7/20872

USPC ......................................... 363/141
See application file for complete search history.

(56) References Cited

U.S. PATENT DOCUMENTS

| | | | | |
|---|---|---|---|---|
| 2006/0239050 A1* | 10/2006 | Andersson | ........... | H05K 7/1432 363/132 |
| 2008/0198548 A1* | 8/2008 | Nakamura | ......... | H05K 7/20927 361/689 |
| 2009/0021971 A1* | 1/2009 | Korich | ............... | H05K 7/20927 363/141 |
| 2012/0188712 A1* | 7/2012 | Ishibashi | ............... | H01L 23/473 361/688 |

(Continued)

FOREIGN PATENT DOCUMENTS

KR 10-2013-0065390 A 6/2013

*Primary Examiner* — Thienvu V Tran
*Assistant Examiner* — Bart Iliya
(74) *Attorney, Agent, or Firm* — Morgan, Lewis & Bockius LLP (57) ABSTRACT

A power converting apparatus includes: a capacitor including a plurality of cells, with a number and arrangement of the cells being determined according to characteristics of a motor; power converters separately disposed on opposite sides of the capacitor; a first cooler including a plurality of cooling tubes through which cooling water flows, located between the capacitor and the power converters, and cooling the capacitor and the power converters by being brought into surface contact with the capacitor and the power converters, with a length of any one of the plurality of the cooling tubes being determined according to the characteristics of the motor; and a housing in which the capacitor, the power converters, and the first cooler are assembled.

11 Claims, 8 Drawing Sheets

(56) References Cited

U.S. PATENT DOCUMENTS

| | | | |
|---|---|---|---|
| 2013/0301220 A1* | 11/2013 | Hotta | H05K 7/20218 361/699 |
| 2014/0160822 A1* | 6/2014 | Kuwano | H05K 7/20945 363/141 |
| 2014/0313671 A1* | 10/2014 | Sugita | H05K 7/20927 361/700 |
| 2018/0146577 A1* | 5/2018 | Ide | H02K 11/33 |

* cited by examiner

POWER CONVERTING APPARATUS

CROSS REFERENCE TO RELATED APPLICATION

The present application claims priority to Korean Patent Application No. 10-2019-0052485, filed May 3, 2019 in the Korean Intellectual Property Office the entire contents of which is incorporated herein for all purposes by this reference.

TECHNICAL FIELD

The present disclosure relates to a power converting apparatus and, more particularly, relates to a power converting apparatus capable of outputting various amounts of power.

BACKGROUND

A power converting apparatus of an eco-friendly automobile receives a DC current from a high voltage battery, converts the DC current into AC current, supplies the AC current to a motor, and controls torque and a rotation speed of the motor by adjusting magnitude and phase of the AC current. In recent years, a power converting apparatus is composed of a power electric (PE) module that is coupled directly with a motor and a speed reducer to eliminate high voltage wires and improve the assemblability of the vehicle. Generally, in the PE module, the motor and the speed reducer are coupled to sides and the power converting apparatus is located thereon.

With the outputs of the motors becoming diversified as eco-friendly automobiles become popular, there occurs a problem that the power converting apparatus needs to be developed individually according to the respective motor outputs. This is because the volume converting tendencies of the motor and the power converting apparatus differ depending on the output. More specifically, when the output of a motor is changed, the motor becomes such that the diameter of the cylindrical shape remains the same but the length in the axial direction thereof varies. On the other hand, once the output is determined, the power converting apparatus generally has an increased or decreased volume because the number of switch elements of power converters, the size of a capacitor and the like of the internal components are changed.

For this reason, conventional power converting apparatuses, once the output of the motor is determined, have been coupled with a motor by a bracket or a tray or have been coping with the problem by developing a new package concept. However, in the case of the former, there is a limit in that the structural stiffness and the like are declined, and in the latter case, there is a limit that the development period and cost are excessive. Accordingly, it is necessary to develop a power converting apparatus that can easily output the required power as the required power is determined.

The foregoing is intended merely to aid in the understanding of the background of the present disclosure, and is not intended to mean that the present disclosure falls within the purview of the related art that is already known to those skilled in the art.

SUMMARY

The present disclosure has been made keeping in mind the above problems occurring in the related art, and an objective of the present disclosure is to provide a power converting apparatus capable of easily outputting a required power according to characteristics of a motor.

According to an exemplary embodiment the present disclosure, a power converting apparatus includes: a capacitor including a plurality of cells, wherein a number and arrangement of the plurality of cells are determined according to characteristics of a motor; power converters separately disposed on opposite sides of the capacitor; a first cooler including a plurality of cooling tubes through which cooling water flows, located between the capacitor and the power converters, and cooling the capacitor and the power converters by being brought into surface contact with the capacitor and the power converters, with a length of any one of the plurality of the cooling tubes being determined according to the characteristics of the motor; and a housing in which the capacitor, the power converters, and the first cooler are assembled.

The first cooler may include a first cooling tube and a second cooling tube that are located on the opposite sides of the capacitor, and a third cooling tube that is located on a surface of the capacitor, wherein the first cooling tube and the second cooling tube are each located between the capacitor and the power converters.

A length of the third cooling tube may be determined in accordance with the number and arrangement of the cells in the capacitor on the basis of the characteristics of the motor.

Lengths of the first cooling tube and the second cooling tube may be determined according to the number of the power converters disposed on the first cooling tube and the second cooling tube.

The housing may be located above a motor housing in which the motor is housed, and the length of at least one of the first cooling tube or the second cooling tube is approximately the same as the diameter length of the motor housing.

The apparatus may further include a second cooler including a plurality of cooling tubes through which cooling water flows, the second cooler cooling the power converters, wherein the power converters are disposed between the first cooler and the second cooler.

The second cooler may include a fourth cooling tube and a fifth cooling tube disposed in parallel with the first cooling tube and the second cooling tube, respectively, and a cooler cover covering the fourth cooling tube and the fifth cooling tube, wherein the power converters are disposed between the first cooling tube and the fourth cooling tube and between the second cooling tube and the fifth cooling tube.

At each of gaps between connected end parts of the first cooling tube and the fourth cooling tube and between connected end parts of the second cooling tube and the fifth cooling tube, a first gasket may be inserted, thereby preventing leakage from the cooling tubes.

The second cooler may be provided with an inlet portion and an outlet portion through which the cooling water is input and output.

The inlet portion and the outlet portion are each configured in a tube shape formed with a groove, and second gaskets are mounted at the inlet portion and the outlet portion, thereby preventing leakage from the inlet portion and outlet portion.

The housing may include: a cooling water inflow portion through which the cooling water flows into; a cooling water outflow portion through which the cooling water having circulated through the first cooler and the second cooler flows out; and a housing cover covering an open top of the housing.

The cooling water inflow portion and the cooling water outflow portion may be connected to the inlet portion and the outlet portion of the second cooler, respectively.

The apparatus may further include a control board controlling the power converters and located above the capacitor.

In the present disclosure, due to the characteristics of the motor, it is easy to realize a cooler corresponding to an increased horizontal length of the capacitor by determining only the length of the third cooling tube on which no power converting module is mounted in the first cooler brought into contact with three surfaces of the capacitor. That is, according to the present disclosure, it is possible to provide a power converting apparatus that is capable of coping with various characteristics of the motor according to the above-described method.

In addition, the first cooling tube is located on one side of the capacitor between the capacitor and the power converters, the second cooling tube is located on an opposite side of the capacitor between the capacitor and the other power converters, and the third cooling tube is located on a surface of the capacitor such that the third cooling tube is in surface contact therewith, whereby the plurality of power converters and the three surfaces of the capacitor can be cooled simultaneously by a single cooling flow path.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION

Hereinbelow, power converting apparatus according to various exemplary embodiments will be described in detail with reference to the accompanying drawings. Throughout the drawings, the same reference numerals will refer to the same or like parts.

Figure 1:
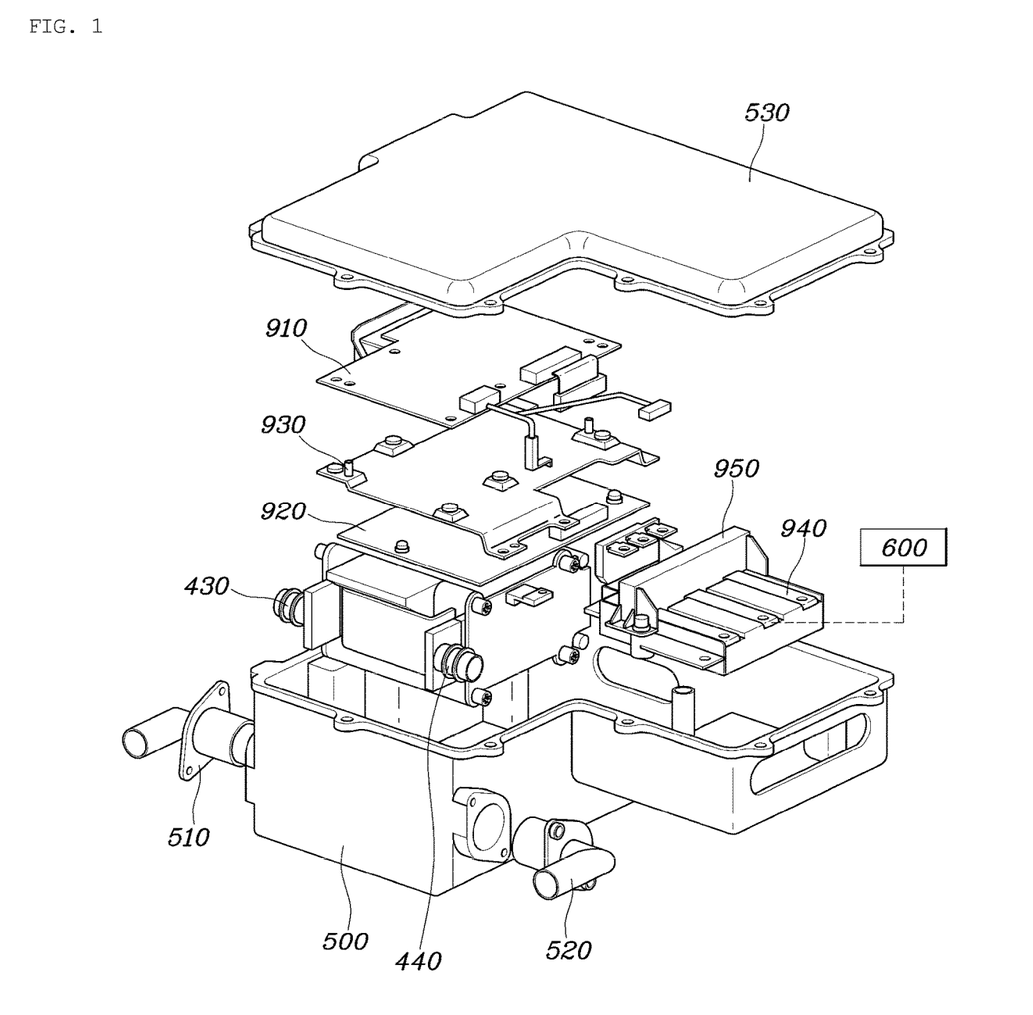
FIG. 1 is an exploded perspective view of a power converting apparatus according to an exemplary embodiment of the present disclosure.
Figure 2:
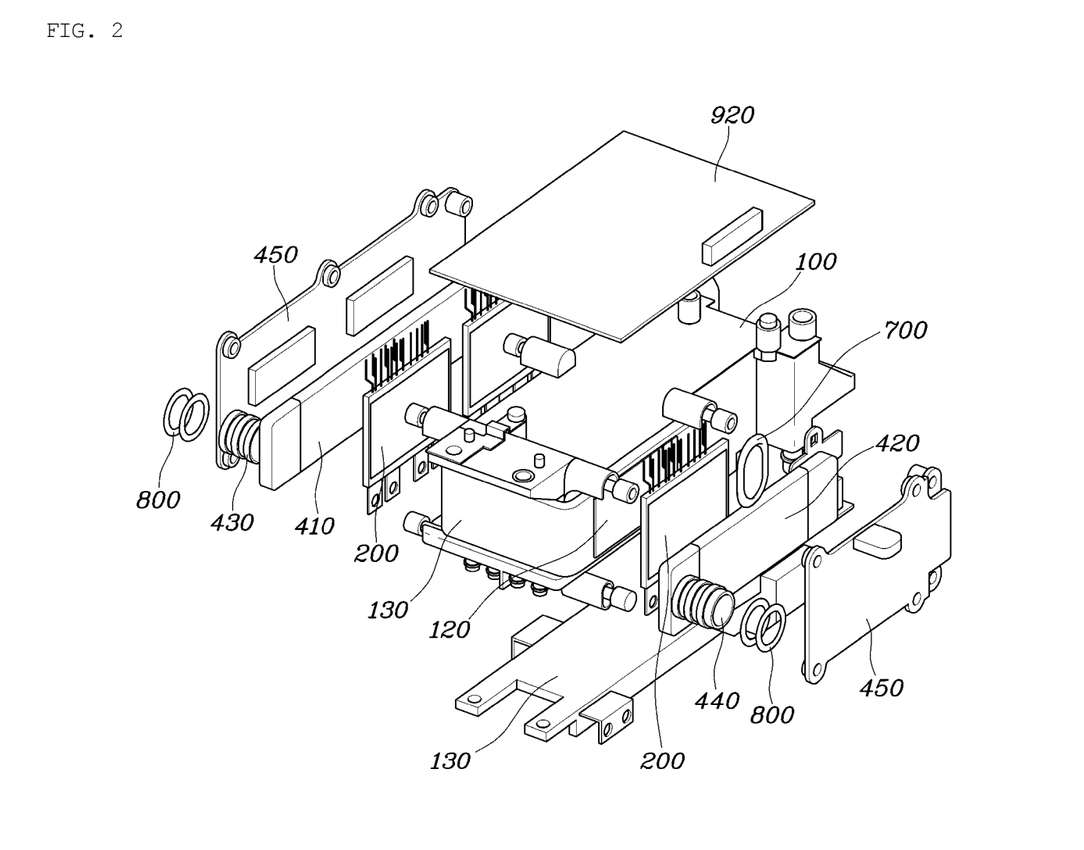
FIG. 2 is an exploded perspective view illustrating a detailed configuration of a first cooler and a second cooler in the power converting apparatus according to the exemplary embodiment of the present disclosure.
Figure 3:
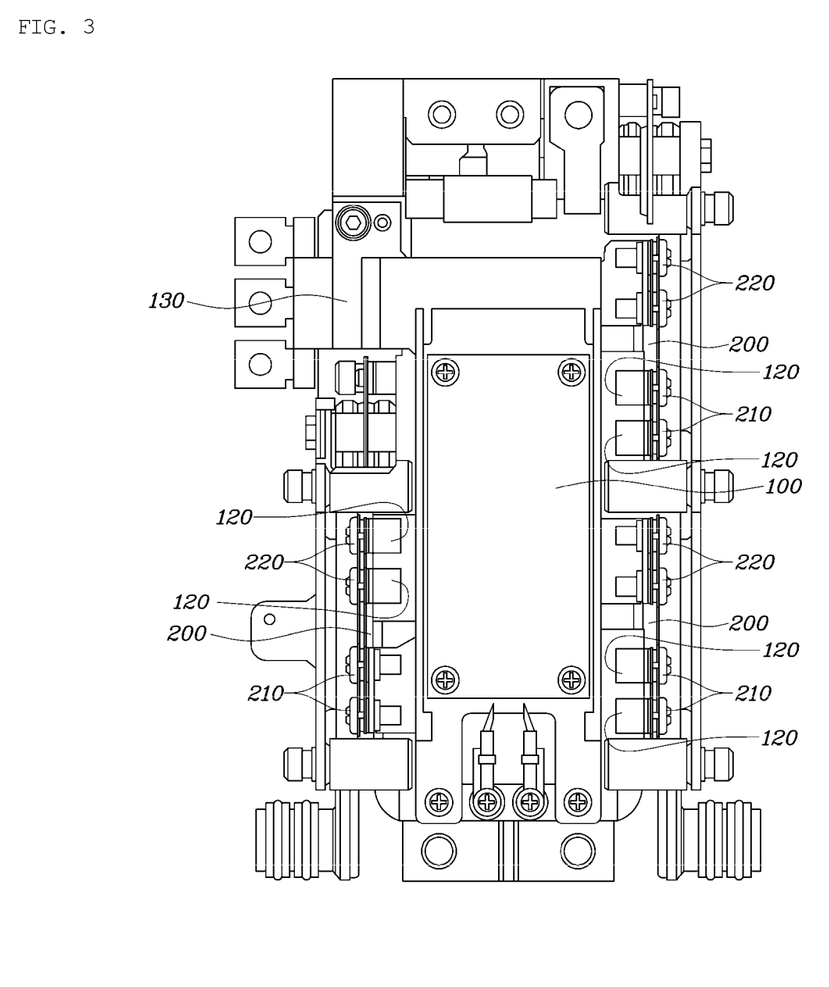
FIG. 3 is a view illustrating a structure in which power converters are separately disposed on opposite sides of a capacitor in the power converting apparatus according to the exemplary embodiment of the present disclosure.
Figure 4:
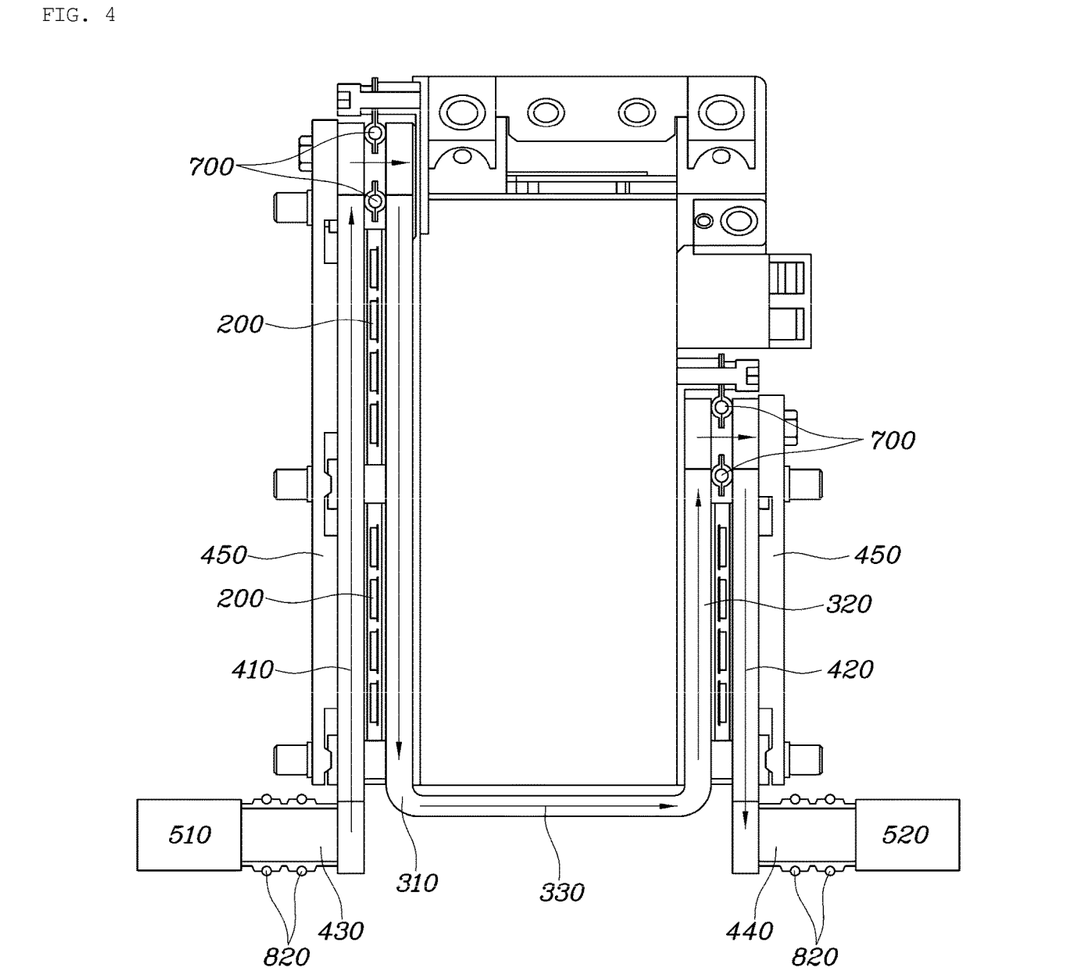
FIG. 4 is a view illustrating a flow of input/output of cooling water in the power converting apparatus according to the exemplary embodiment of the present disclosure.
Figure 5:
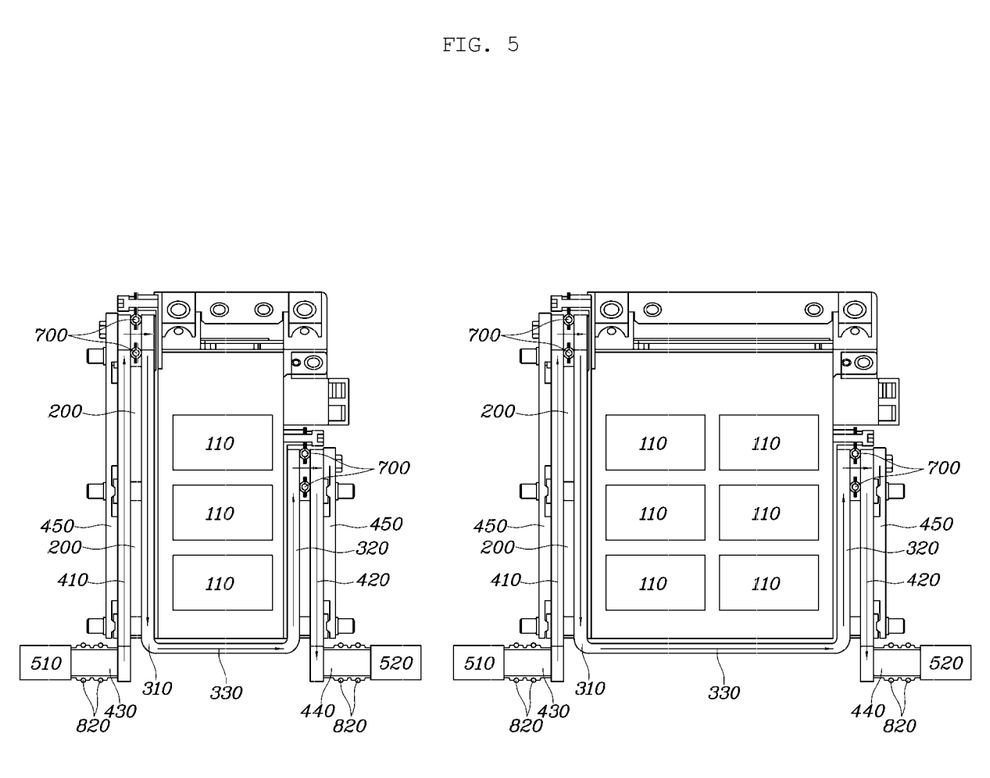
FIG. 5 shows views illustrating that the length of a third cooling tube is determined in accordance with the number and arrangement of cells in the capacitor on the basis of characteristics of a motor in the power converting apparatus according to the exemplary embodiment of the present disclosure.
Figure 6:
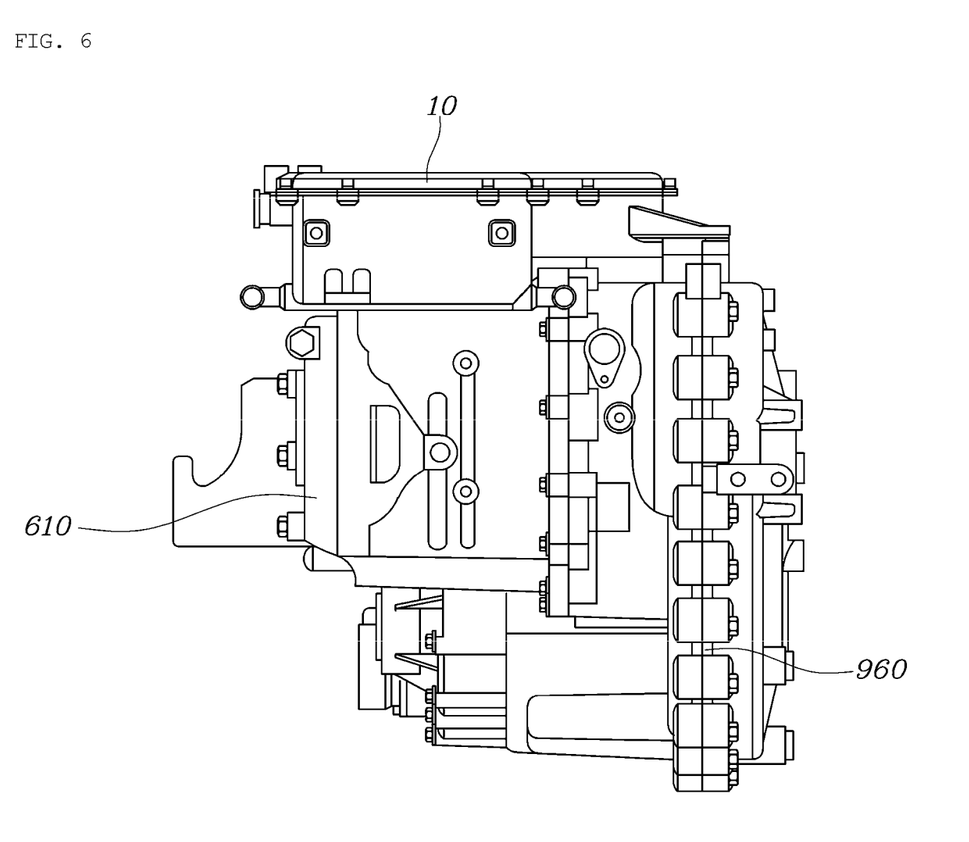
FIG. 6 is a view illustrating the power converting apparatus according to the exemplary embodiment of the present disclosure combined with the motor and a speed reducer.

FIG. 1 is an exploded perspective view of a power converting apparatus according to an exemplary embodiment of the present disclosure, FIG. 2 is an exploded perspective view illustrating a detailed configuration of a first cooler and a second cooler in the power converting apparatus according to the exemplary embodiment of the present disclosure, FIG. 3 is a view illustrating a structure in which power converters are separately disposed on opposite sides of a capacitor in the power converting apparatus according to the exemplary embodiment of the present disclosure, FIG. 4 is a view illustrating a flow of input/output of cooling water in the power converting apparatus according to the exemplary embodiment of the present disclosure, FIG. 5 shows views illustrating that the length of a third cooling tube is determined in accordance with the number and arrangement of cells in a capacitor on the basis of the characteristics of a motor in the power converting apparatus according to the exemplary embodiment of the present disclosure, and FIG. 6 is a view illustrating the power converting apparatus according to the exemplary embodiment of the present disclosure combined with the motor and a speed reducer.

With reference to FIGS. 1 to 5, the power converting apparatus according to the exemplary embodiment of the present disclosure may include a capacitor 100, power converters 200, a first cooler 300, and a housing 500; and may further include a second cooler 400.

The capacitor 100 includes a plurality of cells 110, and the number and arrangement of the cells 110 may be determined according to characteristics of a motor 600. At this time, the characteristics of the motor may include a maximum output of the motor and an outer diameter, a length, a volume, and a rated output of the motor. In addition, the capacitor 100 may receive a direct current from a battery (not shown) of the vehicle and supply the corresponding direct current to the power converters 200. More specifically, with reference to FIG. 3, the capacitor 100 may be disposed under a bottom surface thereof with a current supply terminal 120 supplying a direct current to the power converters 200 and a bus bar 130 transmitting a current output from the power converters 200 to the motor 600. Here, an output terminal 940 of the power converting apparatus may be connected to the motor 600 and the bus bar 130 may be connected to the output terminal 940. Accordingly, a direct current is supplied from the capacitor 100 to the power converters 200 and an alternate current converted in the power converters 200 is supplied to the motor 600 through the bus bar 130 and the output terminal 940, so that the motor 600 may be driven.

Each of the power converters 200 includes a plurality of switching elements and plays a role in converting a direct current supplied from the capacitor 100 into an alternating current. In addition, the power converters 200 in the present disclosure may be separately disposed on opposite sides of the capacitor 100, as shown in FIG. 3.

Generally, a stray inductance may occur in a path through which a direct current is connected between a capacitor and power converters. In order to minimize the stray inductance, a physical distance between the capacitor and the power converters needs to be minimized. In a conventional power converting apparatus, power converters were arranged in a line and the capacitors were arranged as closely thereto as possible, thereby reducing the stray inductance. However, when the capacity of each of the power converters is increased, causing volume of the power converting module to be increased, the capacitor has to be lengthened to the length, in which the power converters are arranged in a row, thereby resulting in a problem that the total volume of the power converting apparatus becomes large.

In the present disclosure, the power converters 200 are separately disposed on the opposite sides of the capacitor 100 as described above, and the current supply terminal 120 of the capacitor and the power converting module input terminal 210 are connected to each other. As a result, the physical distance between the capacitor 100 and the power converters 200 is minimized, whereby the stray inductance may be reduced. In addition, by separately disposing the power converters 200 on the opposite sides of the capacitor 100, it is not necessary to increase the volume of the capacitor 100 even when the capacity of the power converters 200 is increased. Eventually, a total volume of the power converting apparatus may also be minimized.

According to the exemplary embodiment, each of the power converters 200 may be an insulated gate bipolar transistor (IGBT) and the like. However, this is only one embodiment, and various semiconductor elements may be used as the power converters of the present disclosure.

Although not shown in detail in the drawings, each of the power converters 200 may include the power converting module input terminal 210 and a power converting module output terminal 220. At this time, the power converting module input terminal 210 receives the direct current from the capacitor 100 and the power converting module output terminal 220 may output an alternating current that the direct current is converted through a plurality of switching elements in the power converters 200. At this time, the power converting module output terminal 220 may be electrically connected to the bus bar 130.

The first cooler 300 includes a plurality of cooling tubes through which cooling water flows and may be located between the capacitor 100 and the power converters 200. Further, the first cooler 300 may cool the capacitor 100 and the power converter 200 by being brought into contact with the surfaces of the capacitor 100 and the power converters 200. In addition, the length of any one of the plurality of the cooling tubes of the first cooler 300 may be determined according to the characteristics of the motor 600. According to the exemplary embodiment, the length of the one of the plurality of the cooling tubes may be determined according to the maximum amount of output of the motor 600 and the like.

More specifically, with reference to FIG. 4, the first cooler 300 may include a first cooling tube 310 and a second cooling tube 320 that are located on the opposite sides of the capacitor 100, and a third cooling tube 330 that is located on a surface of the capacitor 100. At this time, the first cooling tube 310 and the second cooling tube 320 each may be located between the capacitor 100 and the power converters 200.

On the other hand, conventionally, the power converters are cooled by a cooler, whereas the capacitor is cooled by constituting a separate flow path in the housing or cooled by the cooler having one surface thereof being brought into surface contact with the relevant capacitor. However, according to the present disclosure as described above, the first cooling tube 310 is located on one side of the capacitor 100 between the capacitor 100 and the power converters 200, the second cooling tube 320 is located on an opposite side of the capacitor 100 between the capacitor 100 and the other power converters 200, and the third cooling tube 330 is located on a surface of the capacitor 100 such that the third cooling tube 330 is in surface contact therewith, whereby the plurality of power converters 200 and three surfaces of the capacitor 100 can be cooled simultaneously by a single cooling flow path. In addition, the three surfaces of the capacitor 100 may be cooled at the same time while the opposite sides of each of the power converters 200 are cooled, whereby overall cooling efficiency of the power converting apparatus can be improved.

In addition, the lengths of the first cooling tube 310 and the second cooling tube 320 may be determined on the basis of the number of the power converters 200 disposed on the first cooling tube 310 and the second cooling tube 320, respectively. According to the exemplary embodiment, as shown in FIG. 4, when two power converters 200 are disposed on the first cooling tube 310 and one power converting module 200 is disposed on the second cooling tube 320, the length of the first cooling tube 310 may be configured to be longer than the length of the second cooling tube 320.

Further, the length of the third cooling tube 330 may be determined as the number and arrangement of the cells 110 of the capacitor 100 are determined according to the characteristics of the motor 600. FIG. 5 shows views illustrating that the length of the third cooling tube is determined in accordance with the number and arrangement of the cells in the capacitor on the basis of the characteristics of the motor. The view in the left side of FIG. 5 shows the power converting apparatus of the motor 600 having characteristics of a small capacity and the view in the right side shows the power converting apparatus of the motor 600 having the characteristics of a relatively large capacity.

In general, when the amount of the maximum output of the motor 600 increases, the current flowing through the power converters 200 is increased. Accordingly, it is required to increase the capacity of the capacitor 100, and thus, in order to increase the capacity of the capacitor 100, it is required to increase the number of capacitor cells 110. In the present disclosure, as the amount of the maximum output of the motor 600 increases, the number of the cells 110 of the capacitor 100 is increased, wherein, as shown in FIG. 5, the arrangement of the cells 110 is not changed in a vertical direction and is changed only in a horizontal direction. As a result, the length of the third cooling tube 330 may be determined to a determined horizontal direction length.

As described above, according to the present disclosure, as the characteristics of the motor 600 are determined, by determining only the length of the third cooling tube 330 on which no power converting module 200 is mounted in the first cooler 300 that is in surface contact with the three surfaces of the capacitor 100, it is easy to realize the cooler corresponding to an increased horizontal length of the capacitor 100. That is, according to the present disclosure, it is possible to provide a power converting apparatus that is capable of coping with various characteristics of the motor 600 according to the above-described method.

The second cooler 400 includes a plurality of cooling tubes through which cooling water flows, and functions to cool the power converters 200. At this time, the second cooler 400 may be a cooler provided separately from the first cooler 300 according to an exemplary embodiment, or may be a cooler integrally provided with the first cooler 300 according to another exemplary embodiment. Here, the power converters 200 may be disposed between the first cooler 300 and the second cooler 400. Accordingly, both surfaces of each of the power converters 200 are cooled by the first cooler 300 and the second cooler 400, whereby the cooling performance may be improved.

More specifically, with reference to FIGS. 2 and 4, the second cooler 400 includes the fourth cooling tube 410 and the fifth cooling tube 420 disposed in parallel with the first cooling tube 310 and the second cooling tube 320, respectively, and the power converters 200 may be disposed between the first cooling tube 310 and the fourth cooling tube 410, and between the second cooling tube 320 and the fifth cooling tube 420, respectively. In addition, the second cooler 400 may further include a cooler cover 450 covering the fourth cooling tube 410 and the fifth cooling tube 420.

More specifically, at each of gaps between connected end parts of the first cooling tube 310 and the fourth cooling tube 410 and between connected end parts of the second cooling tube 320 and the fifth cooling tube 420, a first gasket 700 is inserted, thereby preventing leakage from the cooling tubes In addition, the second cooler 400 may be provided with an inlet portion 430 and an outlet portion 440 through which cooling water is input and output. More specifically, the inlet portion 430 and the outlet portion 440 each may be provided at opposite end parts of the one end parts, in which the first gaskets 700 are each inserted, in the fourth cooling tube 410 and the fifth cooling tube 420, respectively. Here, the inlet portion 430 and the outlet portion 440 are each configured in a tube shape formed with a groove, and second gaskets 800 are mounted at the inlet portion 430 and the outlet portion 440, thereby allowing the inlet portion 430 and outlet portion 440 to prevent leakage.

The capacitor 100, the power converters 200, the first cooler 300, and the second cooler 400 may be assembled in the housing 500. More specifically, the housing 500 may include a cooling water inflow portion 510 through which the cooling water flows into, a cooling water outflow portion 520 through which the cooling water having circulated through the first cooler 300 and the second cooler 400 flows out, and a housing cover 530 covering the open top of the housing 500. In addition, the cooling water inflow portion 510 and the cooling water outflow portion 520 may be connected to the inlet portion 430 and the outlet portion 440 of the second cooler 400, respectively. Accordingly, as shown in FIG. 4, the cooling water input into the inlet portion 430 of the second cooler 400 through the cooling water inflow portion 510 circulates through the second cooler 400 and the first cooler 300, thereby cooling the converters 200 and the capacitor 100, and subsequently, may be discharged through the outlet portion 440 and the cooling water outflow portion 520 of the second cooler 400.

Referring to FIG. 6, the housing 500 may be located above a motor housing 610 in which the motor is housed, wherein the length of at least one of the first cooling tube 310 or the second cooling tube 320 may be approximately the same as the diameter length of the motor housing 610.

Referring to FIG. 1, the power converting apparatus according to the present disclosure controls the power converters 200 and may further include a control board 910, a gate board 920, a shield plate 930, a current sensor 950, and the like which are located above the capacitor. Here, the control board 910 and the gate board 920 may be connected to each other through wires and the like and play a role in controlling the power converters 200. In addition, the gate board 920 may be connected to signal terminals (not shown) of the power converters 200, and the control signal is applied to the power converters 200 through the signal terminals, thereby controlling the magnitude of the current converted in the power converters 200. Further, the control board 910 may control the whole power converting apparatus on the basis of the control signal received from the vehicle in connection with the signal end or the like of the vehicle. In addition, the shield plate 930 serves to prevent electromagnetic waves generated from the power converters 200 from being transmitted to the control board 910. In addition, the current sensor 950 is mounted on the output terminal 940 and plays a role in sensing a current in the bus bar 130, thereby transmitting corresponding sensing information to the control board 910.

Figure 7:
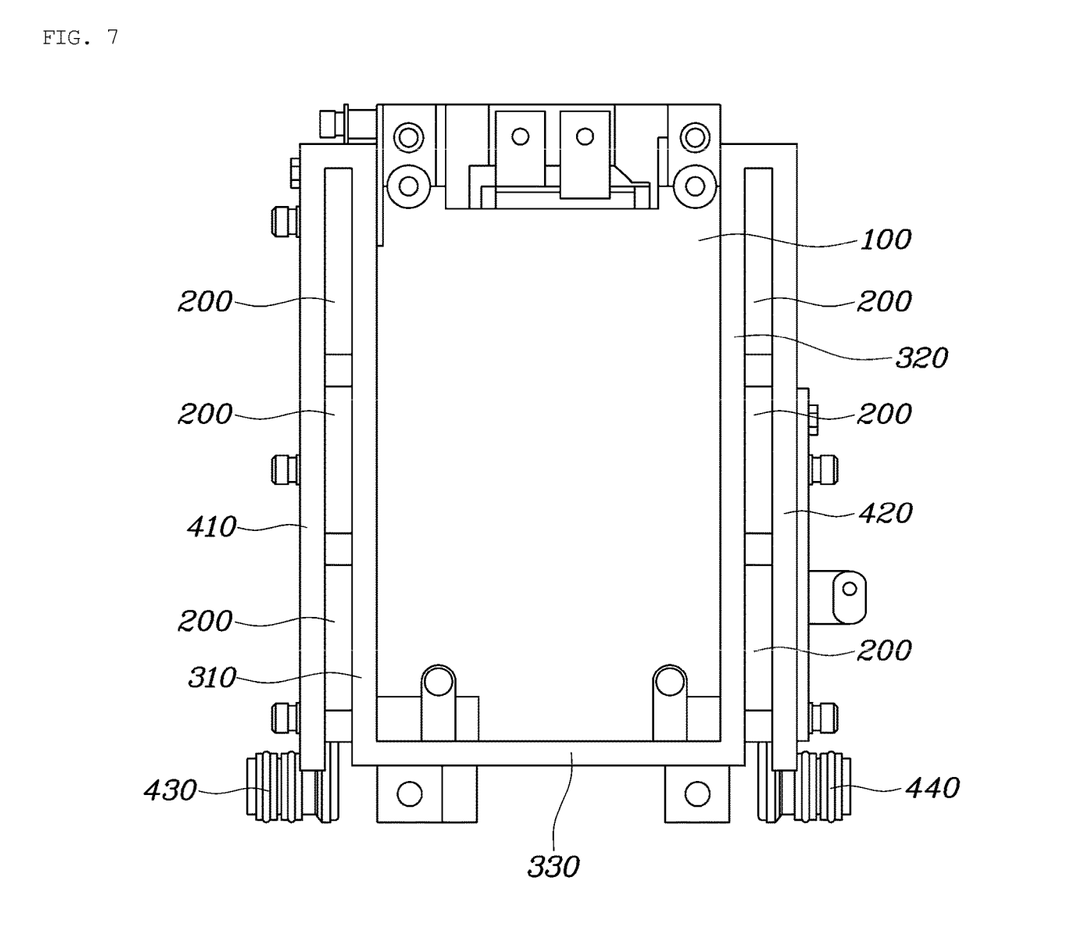
FIG. 7 is a view illustrating a power converting apparatus according to another exemplary embodiment of the present disclosure.
Figure 8:
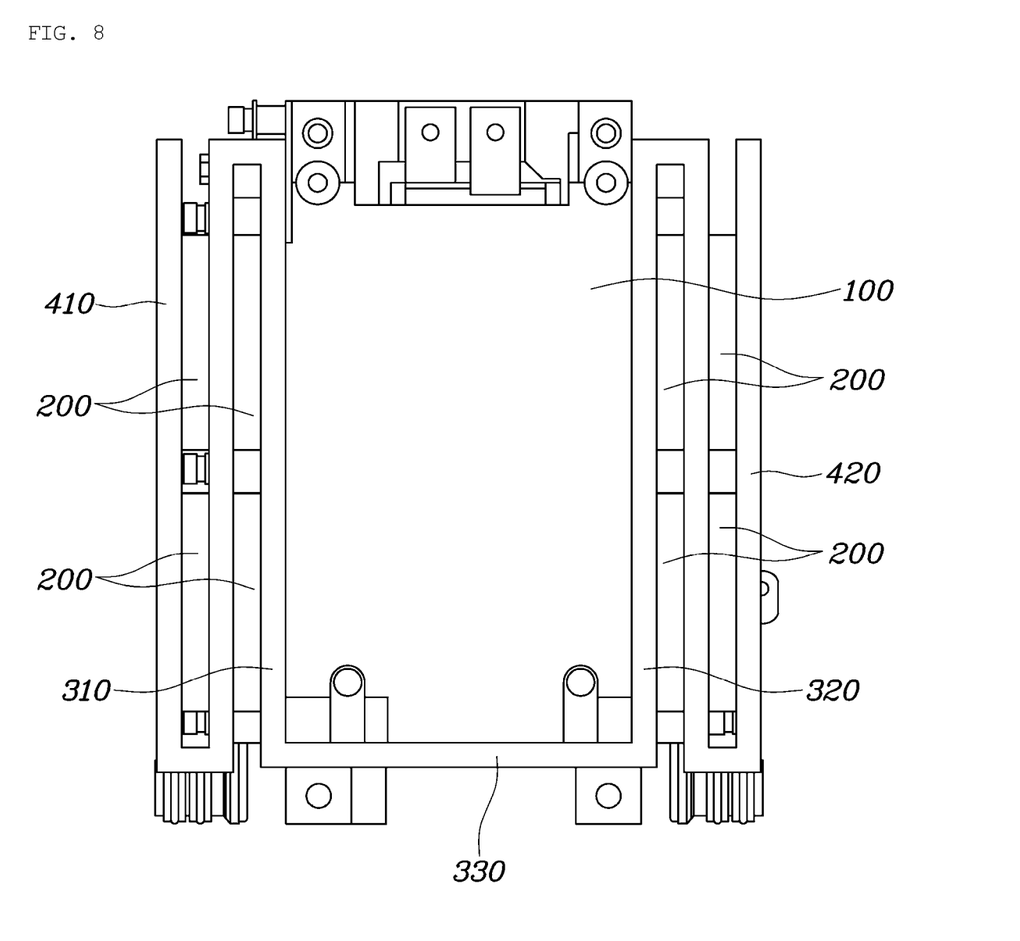
FIG. 8 is a view illustrating a power converting apparatus according to yet another exemplary embodiment of the present disclosure.

FIG. 7 is a view illustrating a power converting apparatus according to another exemplary embodiment of the present disclosure, and FIG. 8 is a view illustrating a power converting apparatus according to yet another exemplary embodiment of the present disclosure. According to the exemplary embodiment, when greater cooling performance is required for the power converters 200, the second cooling tube 320 and the fifth cooling tube 520 may be extended as shown in FIG. 7. Consequentially, the first cooling tube 310, the second cooling tube 320, the fourth cooling tube 410, and the fifth cooling tube 5 may be configured to have the same length. In addition, when the more power converters 200 are used, it is possible to effectively cool the power converters by extending the tubes 410 and 420 of the second cooler as shown in FIG. 8.

Although the exemplary embodiments of the present disclosure has been described for illustrative purposes, those skilled in the art will appreciate that various modifications, additions and substitutions are possible, without departing from the scope and spirit of the present disclosure as disclosed in the accompanying claims.

What is claimed is:

1. A power converting apparatus comprising:
a capacitor including a plurality of cells;
power converters separately disposed on opposite sides of the capacitor;
a first cooler including a plurality of cooling tubes through which cooling water flows, located between the capacitor and the power converters, the first cooler cooling the capacitor and the power converters by being brought into surface contact with the capacitor and the power converters; and
a housing in which the capacitor, the power converters, and the first cooler are assembled,
wherein the first cooler includes:
a first cooling tube and a second cooling tube that are located on the opposite sides of the capacitor; and
a third cooling tube configured such that the first cooling tube and the second cooling tube communicate with each other, the third cooling tube contacting a surface of the capacitor arranged between the opposite sides of the capacitor, and
wherein the first cooling tube and the second cooling tube are each arranged between the capacitor and the power converters.

2. The apparatus of claim 1, wherein lengths of the first cooling tube and the second cooling tube are determined according to the number of the power converters disposed on the first cooling tube and the second cooling tube.

3. The apparatus of claim 1, wherein the housing is located above a motor housing in which the motor is disposed, and
wherein a length of at least one of the first cooling tube or the second cooling tube is approximately the same as a diameter of the motor housing.

4. The apparatus of claim 1, further comprising a second cooler including a plurality of cooling tubes through which cooling water flows and which cools the power converters,
wherein the power converters are disposed between the first cooler and the second cooler.

5. The apparatus of claim 4, wherein the second cooler includes:
   a fourth cooling tube and a fifth cooling tube disposed in parallel with the first cooling tube and the second cooling tube, respectively; and
   a cooler cover covering the fourth cooling tube and the fifth cooling tube,
   wherein the power converters are disposed between the first cooling tube and the fourth cooling tube and between the second cooling tube and the fifth cooling tube.

6. The apparatus of claim 5, wherein, at each of gaps between connected end parts of the first cooling tube and the fourth cooling tube and between connected end parts of the second cooling tube and the fifth cooling tube, a first gasket is inserted, thereby preventing leakage from the cooling tubes.

7. The apparatus of claim 4, wherein the second cooler includes an inlet portion and an outlet portion through which the cooling water is input and output, respectively.

8. The apparatus of claim 7, wherein, the inlet portion and the outlet portion each has a tube shape with a groove, and second gaskets are mounted at the inlet portion and the outlet portion, thereby preventing leakage from the inlet portion and outlet portion.

9. The apparatus of claim 7, wherein the housing includes:
   a cooling water inflow portion through which the cooling water flows into;
   a cooling water outflow portion through which the cooling water circulating through the first cooler and the second cooler flows out; and
   a housing cover covering an open top of the housing.

10. The apparatus of claim 9, wherein the cooling water inflow portion and the cooling water outflow portion are connected to the inlet portion and the outlet portion of the second cooler, respectively.

11. The apparatus of claim 1, further comprising a control board controlling the power converters and located above the capacitor.

* * * * *